(12) United States Patent
Lee et al.

(10) Patent No.: US 12,463,125 B2
(45) Date of Patent: Nov. 4, 2025

(54) SEMICONDUCTOR PACKAGE INCLUDING POST

(71) Applicant: Samsung Electronics Co., Ltd., Suwon-si (KR)

(72) Inventors: Gongje Lee, Seoul (KR); Sangkyu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 387 days.

(21) Appl. No.: 18/060,226

(22) Filed: Nov. 30, 2022

(65) Prior Publication Data
US 2023/0268265 A1 Aug. 24, 2023

(30) Foreign Application Priority Data
Feb. 24, 2022 (KR) .......................... 10-2022-0024071

(51) Int. Cl.
*H01L 23/498* (2006.01)
*H01L 23/00* (2006.01)
*H01L 25/10* (2006.01)

(52) U.S. Cl.
CPC .. *H01L 23/49838* (2013.01); *H01L 23/49822* (2013.01); *H01L 23/49833* (2013.01); *H01L 24/16* (2013.01); *H01L 24/32* (2013.01); *H01L 24/73* (2013.01); *H01L 25/105* (2013.01); *H01L 23/49816* (2013.01); *H01L 24/48* (2013.01); *H01L 2224/16227* (2013.01); *H01L 2224/16238* (2013.01); *H01L 2224/32225* (2013.01); *H01L 2224/48227* (2013.01); *H01L 2224/73204* (2013.01); *H01L 2225/1023* (2013.01);
(Continued)

(58) Field of Classification Search
CPC ......... H01L 23/49838; H01L 23/49822; H01L 23/49833; H01L 25/105
USPC ......................................................... 257/690
See application file for complete search history.

(56) References Cited

U.S. PATENT DOCUMENTS 9,825,005 B2   11/2017   Yeh et al.
10,109,541 B2  10/2018   Baek et al.
(Continued)

FOREIGN PATENT DOCUMENTS

KR   10-2014-0024674 A   3/2014
KR   10-2017-0053268 A   5/2017
(Continued)

*Primary Examiner* — Jasmine J Clark
(74) *Attorney, Agent, or Firm* — Wolf, Greenfield & Sacks, P.C.

(57) ABSTRACT

A semiconductor package according to an example embodiment of the disclosure includes a first redistribution layer including a first via, a first redistribution pattern, and a first insulating layer, a first semiconductor chip connected to the first redistribution layer via a chip connection terminal, a lower post directly connected to the first redistribution layer, an upper post connected to an upper surface of the lower post, a first mold layer at least partially covering the first redistribution layer, the first semiconductor chip, the lower post, and the upper post, and a second redistribution layer on the upper post and the first mold layer. The upper post has a width that gradually increases as the upper post extends from the lower post toward the second redistribution layer. An upper surface of the upper post is coplanar with an upper surface of the first mold layer.

20 Claims, 17 Drawing Sheets

(52) U.S. Cl.
CPC .............. *H01L 2225/1041* (2013.01); *H01L 2225/1058* (2013.01); *H01L 2225/1094* (2013.01); *H01L 2924/1431* (2013.01); *H01L 2924/1436* (2013.01); *H01L 2924/1438* (2013.01)

(56) References Cited

U.S. PATENT DOCUMENTS

| | | |
|---|---|---|
| 11,031,375 B2 | 6/2021 | Lee et al. |
| 2015/0318246 A1 | 11/2015 | Yu et al. |
| 2020/0273804 A1 | 8/2020 | Jeon et al. |
| 2021/0028098 A1 | 1/2021 | Yoo et al. |
| 2021/0035878 A1 | 2/2021 | Jin et al. |
| 2021/0090973 A1 | 3/2021 | Lee et al. |
| 2022/0068822 A1* | 3/2022 | Mun ................ H01L 23/49833 |

FOREIGN PATENT DOCUMENTS

| | | |
|---|---|---|
| KR | 10-2019-0076516 A | 7/2019 |
| KR | 10-2021-0157781 A | 12/2021 |

* cited by examiner

SEMICONDUCTOR PACKAGE INCLUDING POST

CROSS-REFERENCE TO THE RELATED APPLICATION

This application claims priority from Korean Patent Application No. 10-2022-0024071, filed on Feb. 24, 2022, in the Korean Intellectual Property Office, the disclosure of which is incorporated herein by reference in its entirety.

FIELD

The example embodiments of the disclosure relate to a semiconductor package including a post.

BACKGROUND

In a package structure, a chip last structure is weak in terms of securing heat dissipation characteristics because the chip last structure has a smaller thickness than a chip first structure. To secure heat dissipation characteristics of a package in the chip last structure, it is necessary to increase the thickness of the package. For an increase in package thickness, the height of a copper (Cu) post should be increased. In the related art, a copper post is formed using a photosensitive film. However, there is a difficulty in increasing the height of the copper post due to a limited height of currently-usable photosensitive films. In addition, when a desired height of the copper post is secured using two or more photosensitive films, an unnecessary phenomenon such as undercut, etc. may occur in a process procedure.

SUMMARY

The example embodiments of the disclosure provide a semiconductor package having enhanced reliability and enhanced heat dissipation characteristics, and a manufacturing method thereof.

A semiconductor package according to an example embodiment of the disclosure may include a first redistribution layer including a first via, a first redistribution pattern, and a first insulating layer, a first semiconductor chip connected to the first redistribution layer via a chip connection terminal, a lower post directly connected to the first redistribution layer, an upper post connected to an upper surface of the lower post, a first mold layer at least partially covering the first redistribution layer, the first semiconductor chip, the lower post, and the upper post, and a second redistribution layer on the upper post and the first mold layer. The upper post may have a width that gradually increases as the upper post extends from the lower post toward the second redistribution layer. An upper surface of the upper post may be coplanar with an upper surface of the first mold layer.

A semiconductor package according to an example embodiment of the disclosure may include a first redistribution layer comprising a first via, a first redistribution pattern, and a first insulating layer, a first semiconductor chip connected to the first redistribution layer, a lower post directly connected to the first redistribution layer, an upper post connected to the lower post, a first mold layer at least partially covering the first redistribution layer, the first semiconductor chip, the lower post, and the upper post, and a second redistribution layer on the upper post and the first mold layer. The upper post may have a width that gradually increases as the upper post extends from the lower post toward the second redistribution layer. An upper surface of the upper post may be coplanar with an upper surface of the first mold layer. The first mold layer may cover a portion of an upper surface of the lower post.

A semiconductor package according to an example embodiment of the disclosure may include a first semiconductor package, and a second semiconductor package on the first semiconductor package. The first semiconductor package may include a first redistribution layer including a first via, a first redistribution pattern, and a first insulating layer, a first semiconductor chip connected to the first redistribution layer via a chip connection terminal, an underfill layer between the first semiconductor chip and the first redistribution layer and surrounding the chip connection terminal, a lower post directly connected to the first redistribution layer, an upper post connected to an upper surface of the lower post, a first mold layer at least partially covering the first redistribution layer, the first semiconductor chip, the underfill layer, the lower post, and the upper post, and a second redistribution layer on the upper post and the first mold layer. The upper post may have a width that gradually increases as the upper post extends from the lower post toward the second redistribution layer. An upper surface of the upper post may be coplanar with an upper surface of the first mold layer. The first mold layer may cover a portion of the upper surface of the lower post.

DETAILED DESCRIPTION

Figure 1:
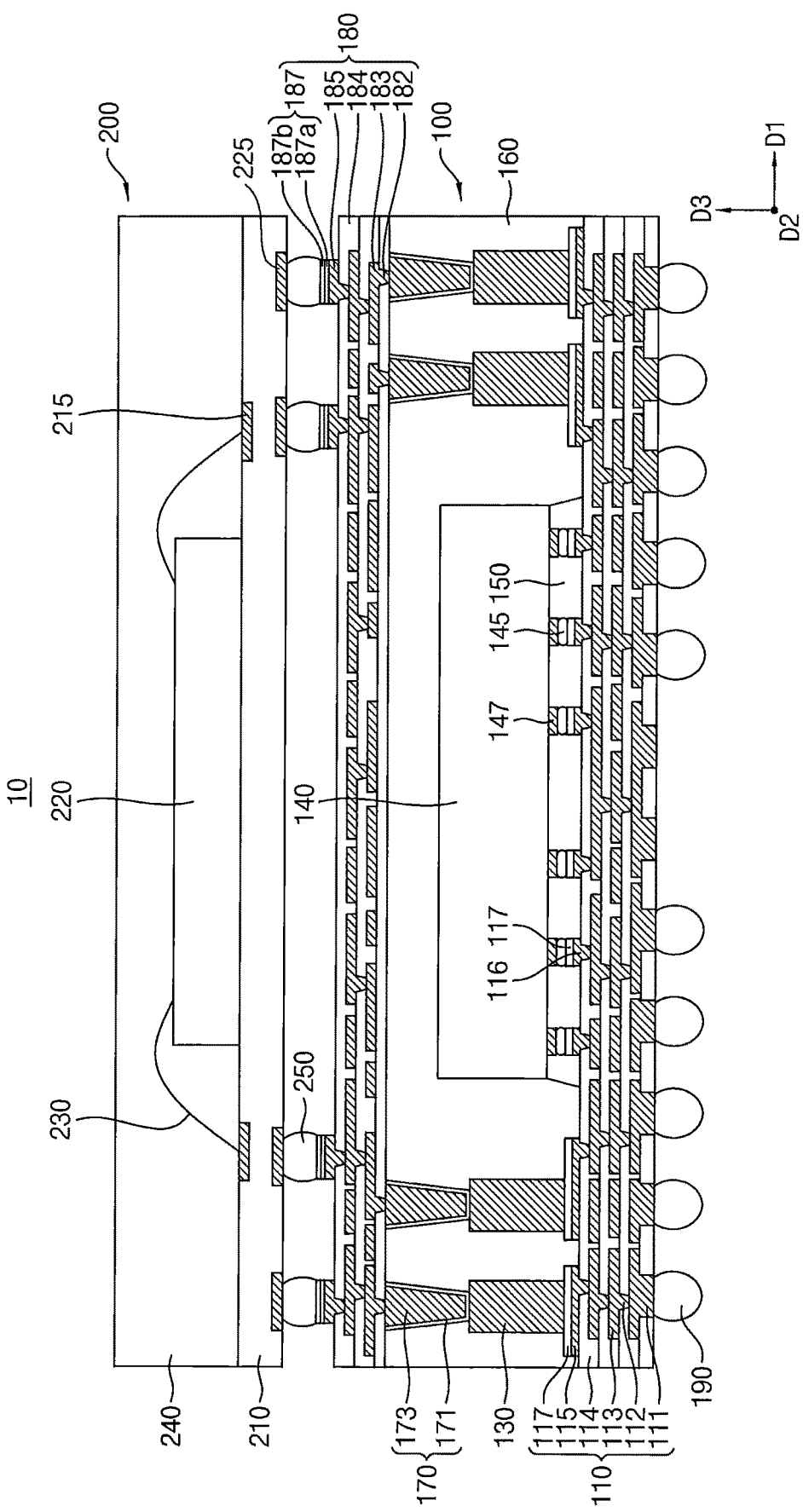
FIG. 1 is a cross-sectional view of a semiconductor package according to an example embodiment of the disclosure.

FIG. 1 is a cross-sectional view of a semiconductor package according to an example embodiment of the disclosure.

Referring to FIG. 1, a semiconductor package 10 may include a first semiconductor package 100 and a second semiconductor package 200. The second semiconductor package 200 may be disposed on the first semiconductor package 100. The semiconductor package 10 may have a package-on-package structure.

The first semiconductor package 100 may include a first redistribution layer 110, a first semiconductor chip 140, a chip connection terminal 145, an underfill layer 150, a second redistribution layer 180, a lower post 130, an upper post 170, and a first mold layer 160.

The first redistribution layer 110 may include first under bump patterns 111, first redistribution patterns 113, first vias 112, first insulating layers 114, first redistribution outer terminals 115, first redistribution connection terminals 116, and a first barrier layer 117.

Each of the first insulating layers 114 may be disposed in parallel to a plane extending in a first direction D1 and a second direction D2. The first direction D1 and the second direction D2 may be perpendicular to each other. The first insulating layers 114 may be stacked in a third direction D3 that is perpendicular to the first direction D1 and the second direction D2 and, as such, may have a multilayer structure. The first insulating layers 114 may include a photosensitive material. In an embodiment, the photosensitive material may include a photosensitive polymer. The photosensitive polymer may include at least one of photosensitive polyimide (PSPI), polybenzoxazole (PBO), a phenolic polymer, a benzocyclobutene (BCB)-based polymer, or a photoimageable dielectric (PID), without being limited thereto. In an embodiment, boundary surfaces of the first insulating layers 114 may not be observed and, as such, the first insulating layers 114 may be observed as a single insulating layer. The first insulating layers 114 may protect the first redistribution patterns 113 and the first vias 112.

The first under bump patterns 111 may be disposed in a lowermost one of the first insulating layers 114. The first under bump patterns 111 may be exposed from the first insulating layer 114 at portions thereof. The first under bump pattern 111 may be directly connected to an outer connection terminal 190. The first under bump patterns 111 may include copper (Cu).

The first redistribution patterns 113 and the first vias 112 may be disposed in the first insulating layers 114. The first redistribution patterns 113 and the first vias 112 may be disposed on the first under bump patterns 111. The first redistribution patterns 113 may be disposed on one first insulating layer 114, and may be covered by another first insulating layer 114 disposed on the one first insulating layer 114. The first redistribution patterns 113 may also have a multilayer structure. The first redistribution patterns 113, which are disposed at different layers, respectively, may be electrically and physically interconnected via the first vias 112. The first via 112 may interconnect the first redistribution patterns 113 while extending through the first insulating layer 114. The first via 112 may interconnect the first under bump pattern 111 and the first redistribution pattern 113 while extending through the first insulating layer 114. The first via 112 may be formed integrally with the first redistribution pattern 113 disposed directly thereon. The first via 112 may have a width gradually increasing as the first via 112 extends in the third direction D3.

The first redistribution outer terminals 115 may be disposed on an uppermost one of the first insulating layers 114. The first redistribution outer terminals 115 may be pads. The first redistribution outer terminals 115 may be disposed in a first region of an upper surface of the first insulating layers 114. The first region may be an edge region of the upper surface of the first insulating layers 114. The first redistribution outer terminal 115 may be connected to the first via 112. The first redistribution outer terminal 115 may be electrically connected to the first redistribution pattern 113 via the first via 112. The first redistribution outer terminal 115 may be formed integrally with the first via 112 directly connected to the first redistribution outer terminal 115.

The first redistribution connection terminals 116 may be disposed on the uppermost one of the first insulating layers 114. The first redistribution connection terminals 116 may be pads. The first redistribution connection terminals 116 may be disposed in a second region of the upper surface of the first insulating layers 114. The second region may be a central region of the upper surface of the first insulating layers 114. The second region is a region inside the first region, and may be surrounded by the first region. The first redistribution connection terminal 116 may be connected to the first via 112. The first redistribution connection terminal 116 may be electrically connected to the first redistribution pattern 113 via the first via 112. The first redistribution connection terminal 116 may be formed integrally with the first via 112 directly connected to the first redistribution connection terminal 116.

First barrier layers 117 may be disposed on the first redistribution outer terminals 115 and the first redistribution connection terminals 116. The first barrier layers 117 may be disposed to cover upper surfaces of the first redistribution outer terminals 115 and the first redistribution connection terminals 116. The first barrier layers 117 may include nickel (Ni) and gold (Au).

The first semiconductor chip 140 may be disposed on the first redistribution layer 110. The first semiconductor chip 140 may be connected to the first redistribution layer 110. The first semiconductor chip 140 may include, for example, a memory chip, a logic chip, or a combination thereof. The first semiconductor chip 140 may be disposed such that chip pads 147 thereof face the first redistribution layer 110.

Chip connection terminals 145 may be disposed between the first redistribution layer 110 and the first semiconductor chip 140. The chip connection terminals 145 may interconnect the first redistribution layer 110 and the first semiconductor chip 140. The chip connection terminal 145 may be directly connected to the chip pad 147 of the first semiconductor chip 140, and may be directly connected to the first barrier layer 117 on the first redistribution connection terminal 116 of the first redistribution layer 110. The first semiconductor chip 140 may be electrically connected to the first redistribution layer 110 via the chip connection terminals 145. The chip connection terminals 145 may each include at least one of a solder, a pillar and a bump. The chip connection terminals 145 may include a conductive material such as tin (Sn), silver (Ag), or the like.

The underfill layer 150 may be provided in a gap region between the first redistribution layer 110 and the first semiconductor chip 140. The underfill layer 150 may surround the chip connection terminals 145 between the first semiconductor chip 140 and the first redistribution layer 110. The underfill layer 150 may cover a bottom surface of the first semiconductor chip 140, and may cover a portion of the upper surface of the first insulating layer 114. The underfill layer 150 may cover at least a portion of the chip pad 147 of the first semiconductor chip 140, and may contact the first redistribution connection terminals 116 of the first redistribution layer 110 and the first barrier layers 117 on the first redistribution connection terminals 116.

Lower posts 130 may be disposed on the first redistribution layer 110. The lower posts 130 may be disposed to be spaced apart from the first semiconductor chip 140. The lower posts 130 may be disposed in the first region which is the edge region of the upper surface of the first insulating layers 114. The lower posts 130 may be disposed at or on opposite sides of the first semiconductor chip 140. In an embodiment, the lower posts 130 may be arranged along a periphery of the first semiconductor chip 140 in plan view.

The lower posts 130 may be directly connected to the first redistribution layer 110. The lower posts 130 may be disposed on the first redistribution outer terminals 115. The lower posts 130 may be disposed to correspond to the first redistribution outer terminals 115, respectively. That is, one lower post 130 may correspond to one first redistribution outer terminal 115. The lower post 130 may be directly connected to the first barrier layer 117 on the first redistribution outer terminal 115. The lower post 130 may be electrically connected to the first redistribution layer 110 via the first redistribution outer terminal 115 and the first barrier layer 117 on the first redistribution outer terminal 115. For example, the lower posts 130 may include copper (Cu).

Upper posts 170 may be disposed on the lower posts 130. The upper posts 170 may be disposed to correspond to the lower posts 130, respectively. That is, one upper post 170 may correspond to one lower post 130. The upper post 170 may be directly connected to an upper surface of the lower post 130. For example, the upper post 170 may include copper (Cu).

The first mold layer 160 may be disposed on the first redistribution layer 110. The first mold layer 160 may cover the first insulating layer 114, the first semiconductor chip 140, the underfill layer 150, the first redistribution outer terminals 115, the first barrier layers 117, the lower posts 130, and the upper posts 170. The first mold layer 160 may contact a portion of the upper surface of the uppermost first insulating layer 114. The first mold layer 160 may contact or surround a side surface and an upper surface of the first semiconductor chip 140. The first mold layer 160 may contact or surround a side surface of the underfill layer 150. The first mold layer 160 may contact or surround a side surface of the first redistribution outer terminals 115. The first mold layer 160 may contact the side surface of the first barrier layer 117 and a portion of an upper surface of the first barrier layers 117. The first mold layer 160 may contact a portion of the upper surface of the lower posts 130 while surrounding a side surface of the lower posts 130. The first mold layer 160 may surround a side surface of the upper posts 170. For example, the first mold layer 160 may include an epoxy molding compound (EMC).

The second redistribution layer 180 may be disposed on the first mold layer 160 and the upper post 170. The second redistribution layer 180 may cover an upper surface of the first mold layer 160 and an upper surface of the upper post 170. The second redistribution layer 180 may be directly connected to the upper post 170. The second redistribution layer 180 may include second vias 182, second redistribution patterns 183, second insulating layers 184, second redistribution outer terminals 185, and second barrier layers 187.

The second insulating layers 184 may each be disposed in parallel to the plane extending in the first direction D1 and the second direction D2. The second insulating layers 184 may be stacked in the third direction D3 and, as such, may have a multilayer structure. The second insulating layers 184 may include a photosensitive material. In an embodiment, the photosensitive material may include a photosensitive polymer. The photosensitive polymer may include at least one of photosensitive polyimide (PSPI), polybenzoxazole (PBO), a phenolic polymer, a benzocyclobutene (BCB)-based polymer, or a photoimageable dielectric (PID), without being limited thereto. In an embodiment, boundary surfaces of the second insulating layers 184 may not be observed and, as such, the second insulating layers 184 may be observed as a single insulating layer. The second insulating layers 184 may protect the second redistribution patterns 183 and the second vias 182. In an embodiment, the second insulating layers 184 may include the same material as the first insulating layers 114.

The second redistribution patterns 183 and the second vias 182 may be disposed in the second insulating layers 184. The second redistribution patterns 183 may be disposed on one second insulating layer 184, and may be covered by another second insulating layer 184 disposed on the one second insulating layer 184. The second redistribution patterns 183 may also have a multilayer structure. The second redistribution patterns 183, which are disposed at different layers, respectively, may be electrically and physically interconnected via the second vias 182. The second via 182 may be formed integrally with the second redistribution pattern 183 disposed directly thereon. The second via 182 may have a width gradually increasing as the second via 182 extends in the third direction D3.

The second via 182 may interconnect the second redistribution patterns 183 while extending through the second insulating layer 184. The second via 182 may interconnect the upper post 170 and the second redistribution pattern 183 while extending through the second insulating layer 184.

The second redistribution outer terminals 185 may be disposed on an uppermost one of the second insulating layers 184. The second redistribution outer terminals 185 may be pads. The second redistribution outer terminal 185 may be connected to the second via 182. The second redistribution outer terminal 185 may be electrically connected to the second redistribution pattern 183 via the second via 182. The second redistribution outer terminal 185 may be formed integrally with the second via 182 directly connected to the second redistribution outer terminal 185. The second redistribution outer terminal 185, the second redistribution pattern 183, and the second via 182 may include copper (Cu).

The second barrier layers 187 may be disposed on the second redistribution outer terminals 185. The second barrier layer 187 may be disposed to cover an upper surface of the second redistribution outer terminal 185. The second barrier layers 187 may include a nickel (Ni) layer 187a on the second redistribution outer terminal 185, and a gold (Au) layer 187b on the nickel layer 187a.

The second semiconductor package 200 may be disposed on the second redistribution layer 180. The second semiconductor package 200 may include a package substrate 210, a second semiconductor chip 220, and a second mold layer 240. The package substrate 210 may be a printed circuit board or a redistribution substrate. Metal pads 215 may be provided at the package substrate 210.

The second semiconductor chip 220 may be a memory chip such as DRAM or NAND flash. The second semiconductor chip 220 may be a kind of semiconductor chip different from that of the first semiconductor chip 140. The second semiconductor chip 220 may be electrically connected to the package substrate 210 via a wire 230 through wire boding.

A package connection terminal 250 may be disposed between the first semiconductor package 100 and the second semiconductor package 200. The package connection terminal 250 may be disposed on the second redistribution outer terminal 185. The package connection terminal 250 may directly contact the second barrier layer 187 on the second redistribution outer terminal 185, and may directly contact a metal pad 225 of the package substrate 210.

Figure 2:
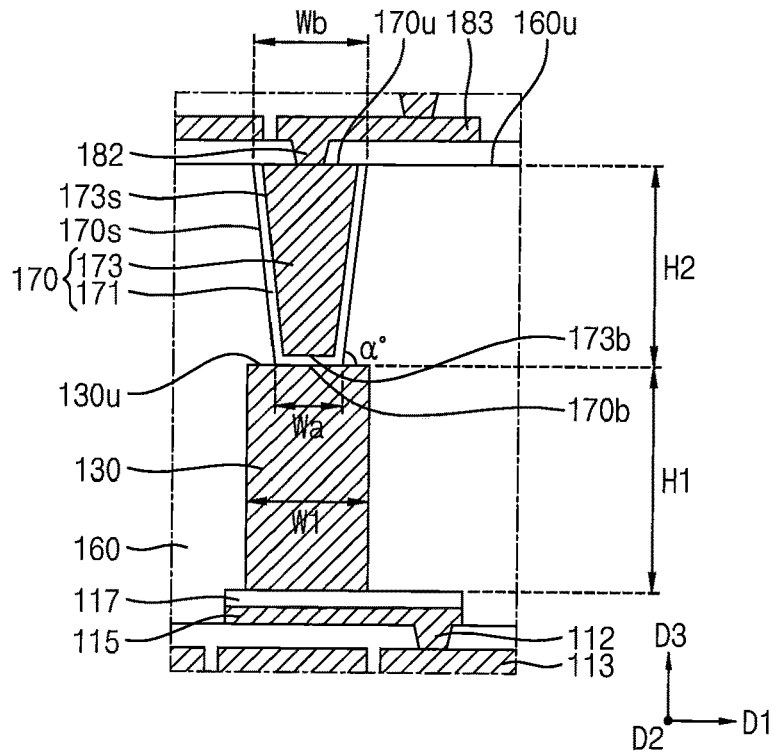
FIG. 2 is an enlarged view of a region of the semiconductor package shown in FIG. 1.

FIG. 2 is an enlarged view of a region of the semiconductor package shown in FIG. 1.

Referring to FIGS. 1 and 2, the upper post 170 may include a seed layer 171 and a conductive structure 173. The seed layer 171 may surround a side surface 173s of the conductive structure 173, and may cover a bottom surface 173b of the conductive structure 173. The seed layer 171 may be interposed between the conductive structure 173 and the lower post 130 and between the conductive structure 173 and the first mold layer 160. The seed layer 171 may directly contact the first mold layer 160 and the lower post 130, and the conductive structure 173 may not directly contact the first mold layer 160 and the lower post 130. The seed layer 171 may include copper (Cu), and the conductive structure 173 may include copper (Cu). The seed layer 171 and the conductive structure 173 may include the same material, but may be distinguished from each other in terms of roughness. The seed layer 171 may have a thickness of about 0.5 to 1 µm.

The upper post 170 may have a width gradually increasing as the upper post 170 extends in the third direction D3. That is, the width of the upper post 170 may gradually increase as the upper post 170 extends toward the second redistribution layer 180. The upper post 170 may have a smallest width Wa at a bottom surface 170b thereof while having a greatest width Wb at an upper surface 170u thereof. The lower post 130 may have a width W1 that is uniform in the third direction D3. The width W1 of the lower post 130 may be about 140 to 160 µm. The width Wa of the bottom surface 170b of the upper post 170 may be smaller than the width W1 of the lower post 130. Accordingly, the upper post 170 may contact a portion of an upper surface 130u of the lower post 130, and may not contact the other portion of the upper surface 130u of the lower post 130. The portion of the upper surface 130u of the lower post 130 not contacting the upper post 170 may contact the first mold layer 160. The width Wa of the bottom surface 170b of the upper post 170 may be about 60 to 70 µm. The width Wb of the upper surface 170u of the upper post 170 may be about 110 to 130 µm.

The side surface 170s of the upper post 170 may be inclined. The side surface 170s of the upper post 170 may be inclined with respect to the upper surface 130u of the lower post 130. For example, an angle α of the side surface 170s of the upper post 170 with respect to the upper surface of the lower post 130 may be 75 to 80°.

The lower post 130 may have a height H1 of about 110 to 130 The upper post 170 may have a height H2 of about 110 to 130 µm. In an embodiment, the height H1 of the lower post 130 may be substantially equal to the height H2 of the upper post 170. The level of the upper surface 130u of the lower post 130 may be lower than the level of the upper surface of the first semiconductor chip 140 with reference to a bottom surface of the first redistribution layer 110.

The upper surface 170u of the upper post 170 may be coplanar with the upper surface 160u of the first mold layer 160. An upper surface of the conductive structure 173 of the upper post 170, an upper end or upper surface of the seed layer 171 of the upper post 170, and the upper surface of the first mold layer 160 may be coplanar.

In an embodiment, a vertical line extending in the third direction D3 while passing through a center of the lower post 130 may pass through a center of the upper post 170. That is, the center of the lower post 130 and the center of the upper post 170 may overlap each other or be aligned in the third direction D3.

Figure 3:
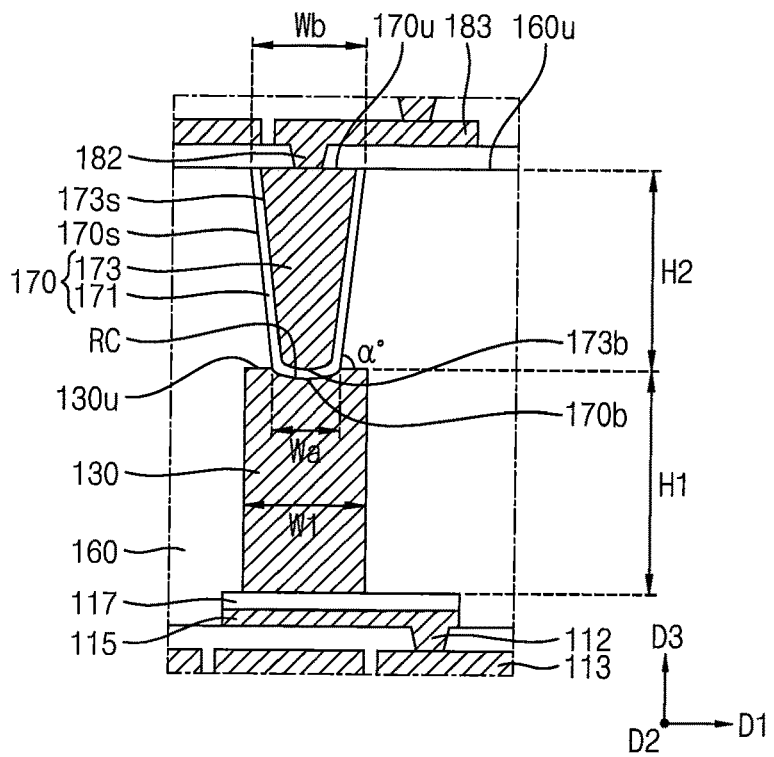
FIG. 3 is an enlarged view showing a region of a semiconductor package according to an example embodiment of the disclosure.

FIG. 3 is an enlarged view showing a region of a semiconductor package according to an example embodiment of the disclosure.

Referring to FIG. 3, a recess RC may be formed at a lower post 130. The recess RC may be formed at an upper portion of the lower post 130. The recess RC may have a shape in which a portion of an upper surface of the lower post 130 is recessed to be concave toward a bottom surface of the lower post 130. The recess RC may be completely covered by a bottom surface 170b of an upper post 170. A seed layer 171 of the upper post 170 may completely cover a surface of the recess RC. The bottom surface 170b of the upper post 170 may extend along the surface of the recess RC. The bottom surface 170b of the upper post 170 may be convex toward the bottom surface of the lower post 130 along a profile of the surface of the recess RC. The level of a lowermost end of the bottom surface 170b of the upper post 170 may be lower than the level of the upper surface 130u of the lower post 130.

FIGS. 4 to 18 are cross-sectional views explaining a semiconductor package manufacturing method according to an example embodiment of the disclosure.

Figure 4:
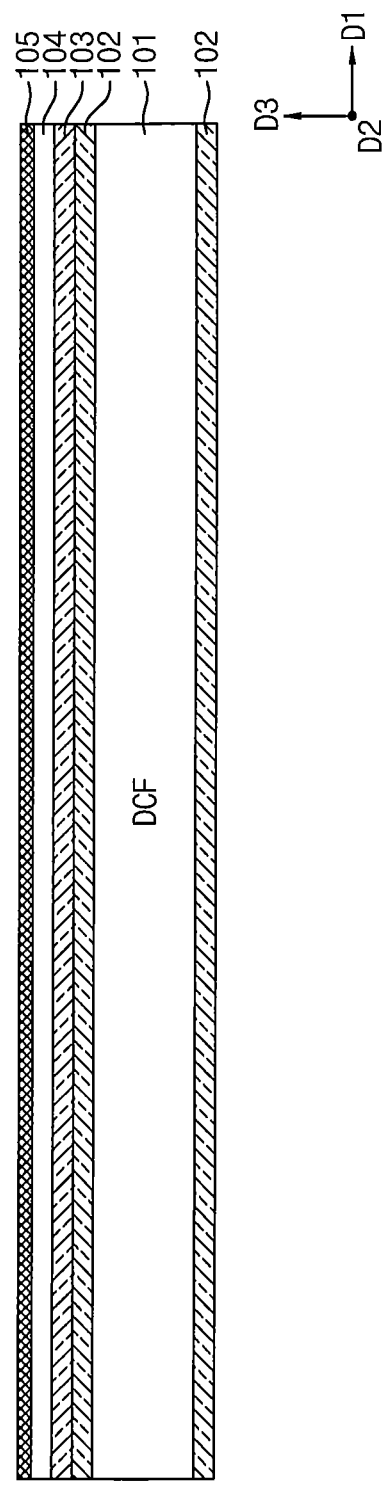
FIGS. 4 to 18 are cross-sectional views explaining a semiconductor package manufacturing method according to an example embodiment of the disclosure.

Referring to FIG. 4, a release layer 103, an insulating layer 104, and a seed layer 105 may be formed on a carrier film 101 and 102. The carrier film 101 and 102 may be a copper clad laminate, such as a detach core film (DCF), including a core insulating layer 101, and a metal layer 102 covering opposite surfaces of the core insulating layer 101. The core insulating layer 101 may be made of a soft material such as polyimide (PI) or the like, or a hard material using a clumping material such as glass fiber, bismaleimide triazine (BT), an epoxy resin, a phenolic resin, or the like. For example, the core insulating layer 101 may be made of a semi-cured prepreg including an epoxy resin and glass fiber. The metal layer 102 may be a copper layer.

In some embodiments, the carrier film 101 and 102 may be an adhesive film of various known types. For example, the adhesive film may be a thermally curable adhesive tape exhibiting an adhesion reduced by thermal treatment or an ultraviolet curable adhesive tape exhibiting an adhesion reduced by irradiation with ultraviolet light.

The release layer 103 may be formed on the metal layer 102. The release layer 103 may cover an exposed upper surface of the metal layer 102. The release layer 103 may be separated from the metal layer 102 by predetermined external force. The release layer 103 may be made of a metal different from a constituent material of the metal layer 102. The release layer 103 may be made of a metal exhibiting relatively low reactivity with the metal layer 102. For example, the release layer 103 may be made of chromium (Cr), nickel (Ni), zinc (Zn), molybdenum (Mo), tungsten (W), cobalt (Co), lead (Pb), silver (Ag), tantalum (Ta), copper (Cu), aluminum (Al), manganese (Mn), iron (Fe), titanium (Ti), tin (Sn), steel, vanadium (V), or a combination thereof. For example, when the metal layer 102 is made of copper (Cu), the release layer 103 may be made of chromium (Cr) or nickel (Ni).

The insulating layer 104 may be formed on the release layer 103. The insulating layer 104 may cover an exposed upper surface of the release layer 103. The release layer 103 may be disposed between the insulating layer 104 and the metal layer 102. The insulating layer 104 may be a photosensitive insulating material and, for example, may be a photoimageable dielectric (PID). The insulating layer 104 may be formed through a coating process such as spin coating, spray coating, dip coating, or the like.

The seed layer 105 may be formed on the insulating layer 104. The seed layer 105 may cover an exposed upper surface of the insulating layer 104. For example, the seed layer 105 may include titanium (Ti) and/or copper (Cu). The seed layer 105 may be formed through chemical vapor deposition (CVD), physical vapor deposition (PVD), or sputtering.

Figure 5:
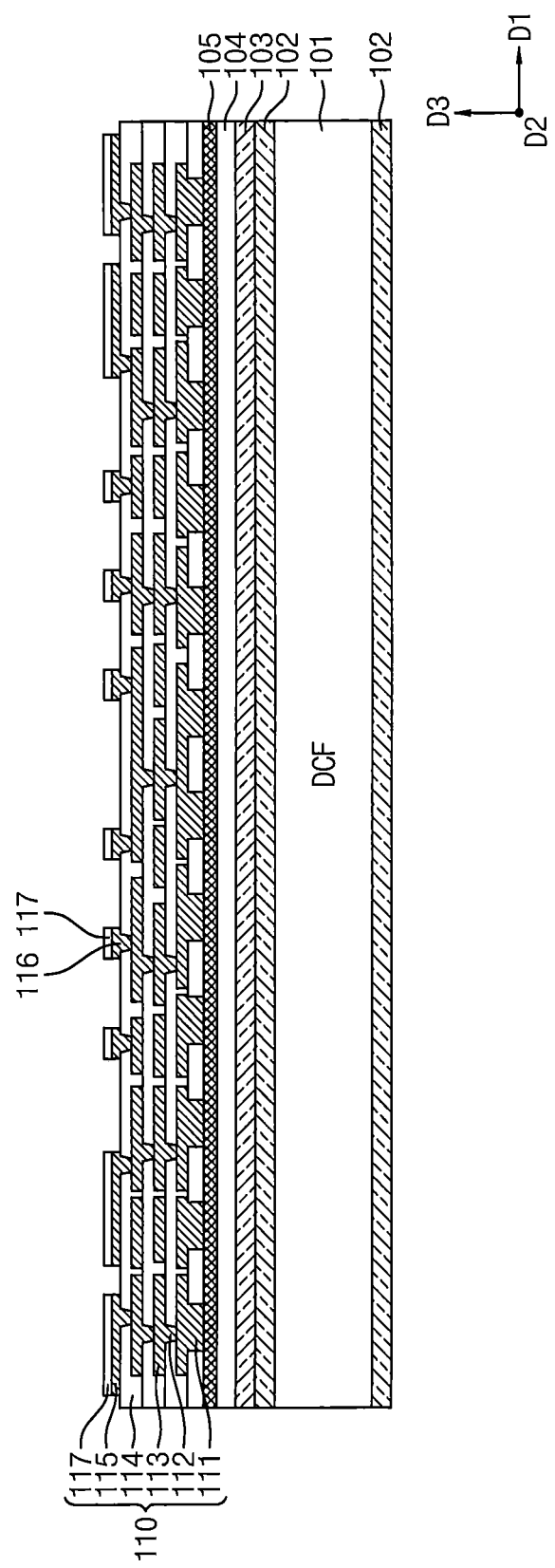

Referring to FIG. 5, a first redistribution layer 110 may be formed on the seed layer 105. In some embodiments, forming the first redistribution layer 110 may include depositing or coating a photosensitive material on the seed layer 105, forming an opening at the photosensitive material through exposure and development processes, and filling the opening with a conductive material.

The first redistribution layer 110 may include first under bump patterns 111, first vias 112, first redistribution patterns 113, first insulating layers 114, first redistribution outer terminals 115, first redistribution connection terminals 116, and first barrier layers 117.

In an embodiment, the first insulating layer 114 may be formed on the seed layer 105. The first insulating layer 114 may include openings partially exposing the seed layer 105. The first under bump patterns 111 may be formed in the openings by performing an electroplating process using the seed layer 105 as an electrode. The first insulating layer 114 may be formed on the first under bump patterns 111. The first via 112 may be formed to extend through the first insulating layer 114, and the first redistribution pattern 113 may be formed on the first insulating layer 114. The first via 112 and the first redistribution pattern 113 may be formed in the same manner as formation of the first under bump pattern 111. Thereafter, the process of forming the first insulating layer 114, the first via 112 and the first redistribution pattern 113 may be repeated.

The first redistribution outer terminals 115 may be formed on the first insulating layer 114. A side surface and an upper surface of the first redistribution outer terminals 115 may not be covered by the first insulating layer 114. The first redistribution outer terminals 115 may be disposed in a first region of an upper surface of the first insulating layer 114. The first region may be an edge region of the upper surface of the first insulating layer 114. The first redistribution outer terminals 115 may be pads.

The first redistribution connection terminals 116 may be formed on the first insulating layer 114. A side surface and an upper surface of the first redistribution connection terminals 116 may not be covered by the first insulating layer 114. The first redistribution connection terminals 116 may be disposed in a second region of the upper surface of the first insulating layer 114. The second region may be more centrally disposed than the first region. The first region may surround the second region. The first region may be a region nearer to a side surface of the first insulating layer 114 than the second region.

The first under bump patterns 111, the first redistribution patterns 113, the first vias 112, the first redistribution outer terminals 115, and the first redistribution connection terminals 116 may include a conductive material. In an embodiment, the conductive material may include a metal such as copper or aluminum.

The first barrier layers 117 may be formed on the first redistribution outer terminals 115 and the first redistribution connection terminals 116. The first barrier layers 117 may be formed to cover an upper surface of the first redistribution outer terminals 115 and an upper surface of the first redistribution connection terminals 116. The first barrier layers 117 may include nickel (Ni) and gold (Au). When the first redistribution connection terminal 116 directly contacts a solder ball upon mounting a first semiconductor chip 140 (cf. FIG. 9) on the first redistribution layer 110 via the solder ball in a subsequent process, a void may be generated due to a metal diffusion rate difference between copper (Cu) constituting the first redistribution connection terminals 116 and tin (Sn) of the solder ball. To this end, the first barrier layers 117 may be disposed on the first redistribution connection terminals 116 such that the first barrier layers 117 may directly contact the solder ball and, as such, it may be possible to prevent generation of a void. In addition, gold (Au) of the first barrier layer 117 may secure solderability between the solder ball and the first barrier layer 117.

The first redistribution outer terminals 115, the first redistribution connection terminals 116, and the first barrier layers 117 may be formed in the same manner as formation of the first redistribution pattern 113 and the first via 112.

Figure 6:
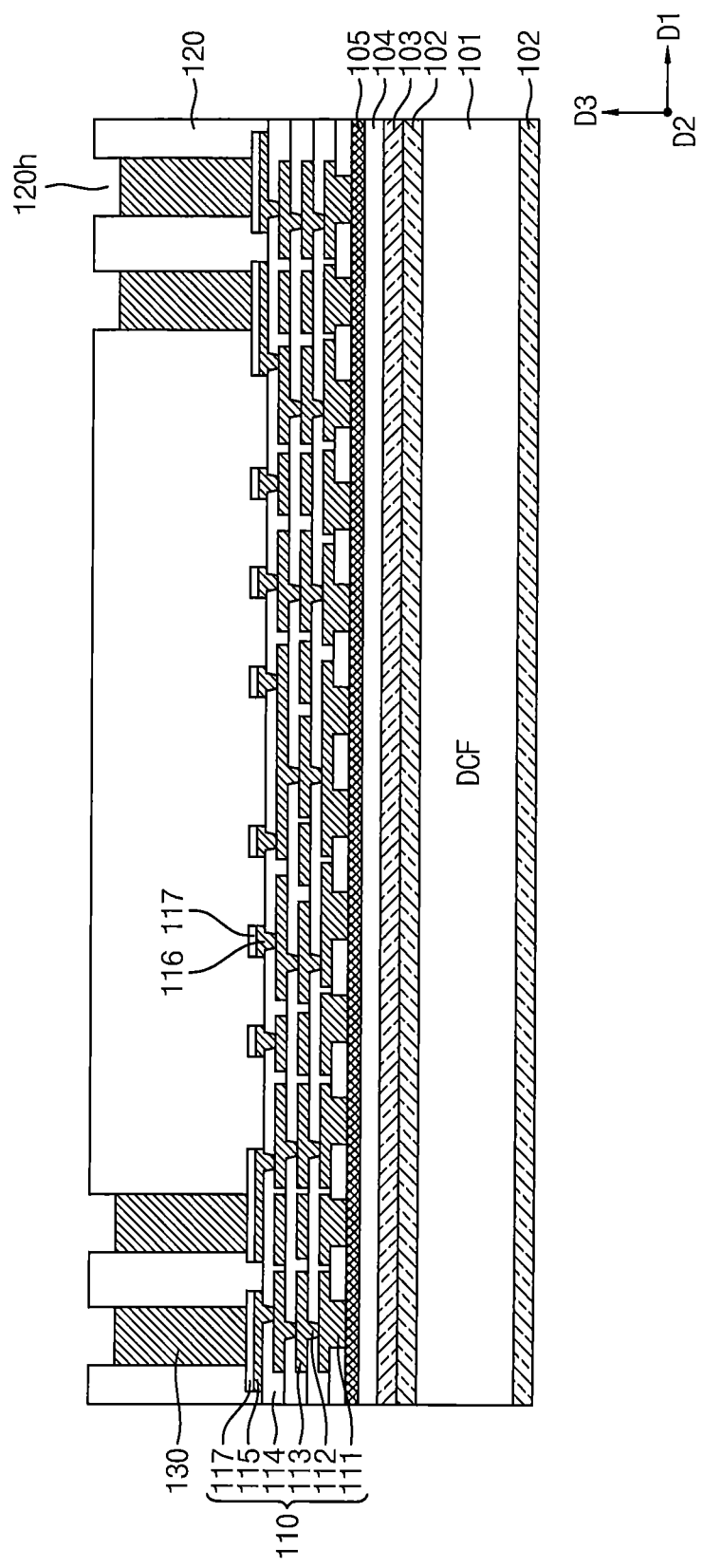

Referring to FIG. 6, a first dry film resist (DFR) layer 120 may be formed on the first redistribution layer 110. The first DFR layer 120 may be formed to take the form of a film laminated on the first redistribution layer 110. The first DFR layer 120 may cover an exposed upper surface of the first insulating layer 114. The first DFR layer 120 may cover the side surface of the first redistribution outer terminals 115 and the side surface of the first redistribution connection terminals 116. The first DFR layer 120 may cover the first barrier layers 117 on the first redistribution outer terminals 115 and the first barrier layers 117 on the first redistribution connection terminals 116.

Holes 120h may be formed at the first DFR layer 120 through exposure and development processes. The holes 120h may be disposed in the first region which is the edge region of the upper surface of the first insulating layer 114. The holes 120h may be arranged along a peripheral portion of the first redistribution layer 110. The hole 120h may expose at least a portion of the first barrier layer 117 on the first redistribution outer terminal 115 of the first redistribution layer 110. The holes 120h may be formed to correspond to the first redistribution outer terminals 115, respectively. The hole 120h may have a uniform width without variation as the hole 120h extends from an upper surface of the first DFR layer 120 toward the first redistribution layer 110.

Lower posts 130 may be formed in the holes 120h formed at the first DFR layer 120, respectively. One lower post 130 may be formed in one hole 120h. The lower posts 130 may each be a conductor. In an embodiment, the lower posts 130 may be formed through an electroplating process. For example, the lower posts 130 may be formed through an electroplating process using, as an electrode, a seed layer (not shown) used to form the first redistribution connection terminal 116, the first via 112 connected to the first redistribution connection terminal 116, the first redistribution outer terminal 115 and the first via 112 connected to the first redistribution outer terminal 115. The lower post 130 may be formed on the first barrier layer 117. The lower post 130 may be connected to or contact the first barrier layer 117. The lower post 130 may be electrically connected to the first redistribution outer terminal 115. The lower post 130 may be electrically connected to the first redistribution pattern 113 and the first via 112. An upper surface of the lower post 130 may be disposed at a lower level than the upper surface of the first DFR layer 120.

Figure 7:
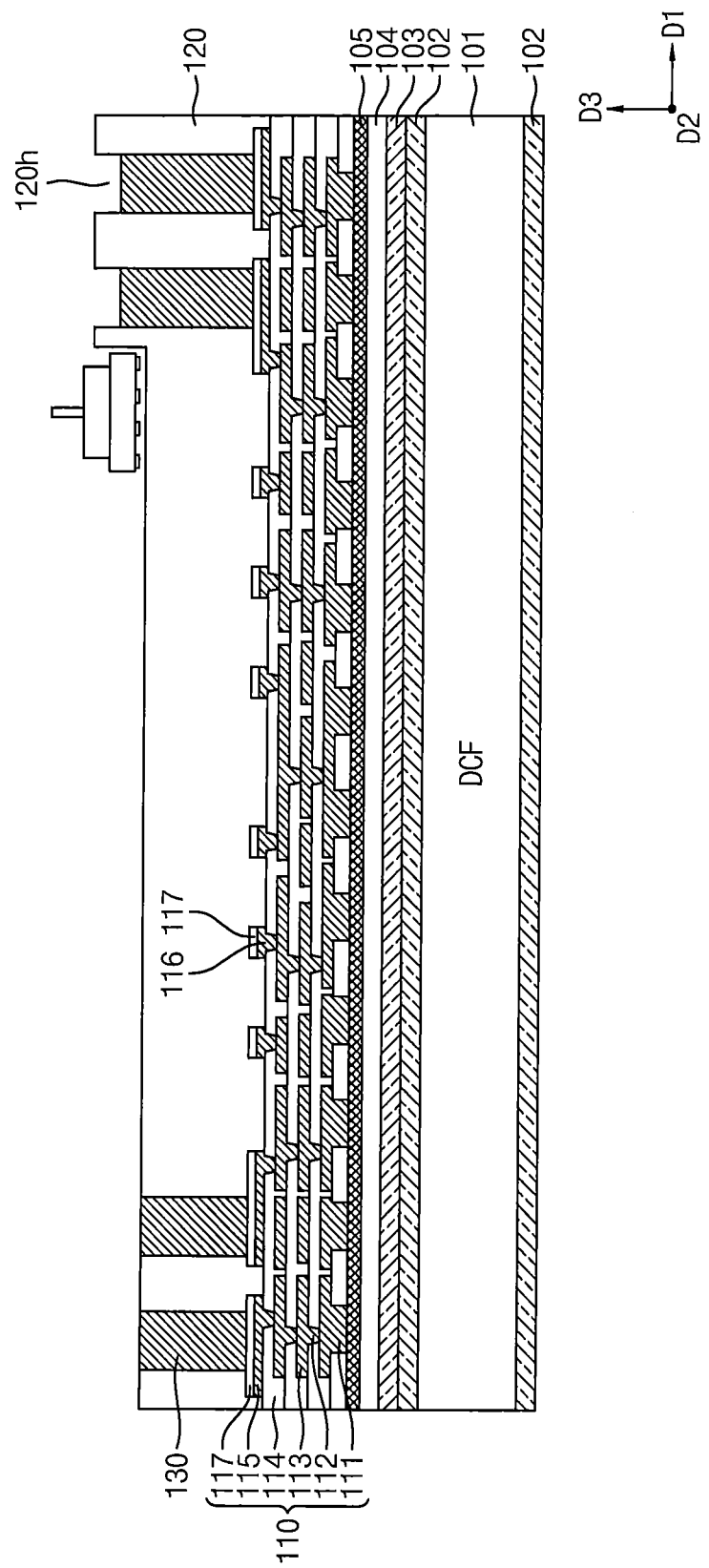

Referring to FIG. 7, upper portions of the first DFR layer 120 and the lower posts 130 may be partially removed. For example, a portion of each of the first DFR layer 120 and the lower posts 130 may be removed through execution of a grinding process. As the portion of each of the first DFR layer 120 and the lower posts 130 is removed, the height of the first DFR layer may be lowered, and the height of the lower posts 130 may be lowered. An upper surface of the first DFR layer 120 and an upper surface of the lower posts 130 may be coplanar.

Figure 8:
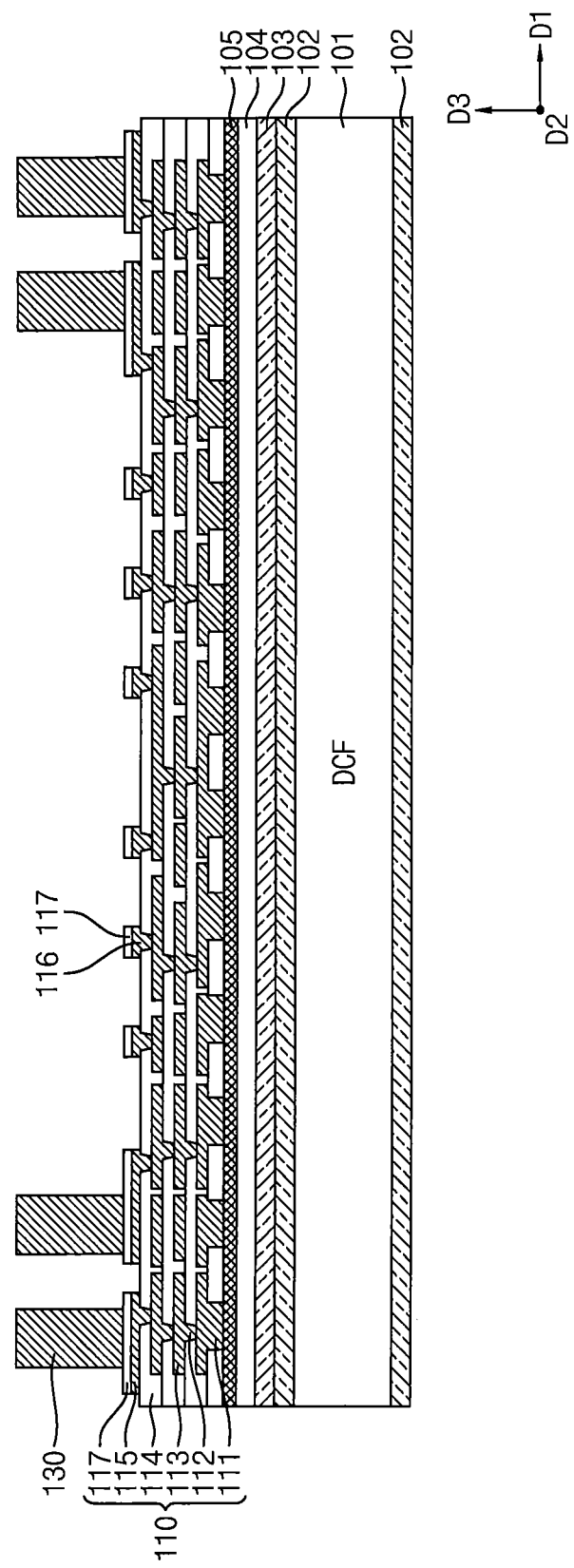

Referring to FIG. 8, the first DFR layer 120 may be removed. In an embodiment, the first DFR layer 120 may be removed through a stripping process. As the first DFR layer 120 is removed, a side surface of the lower posts 130 may be exposed. As the first DFR layer 120 is removed, a portion of the upper surface of the first insulating layer 114, the side surface of the first redistribution connection terminals 116, the side surface of the first redistribution outer terminals 115, and at least a part of the first barrier layers 117 may be exposed.

Figure 9:
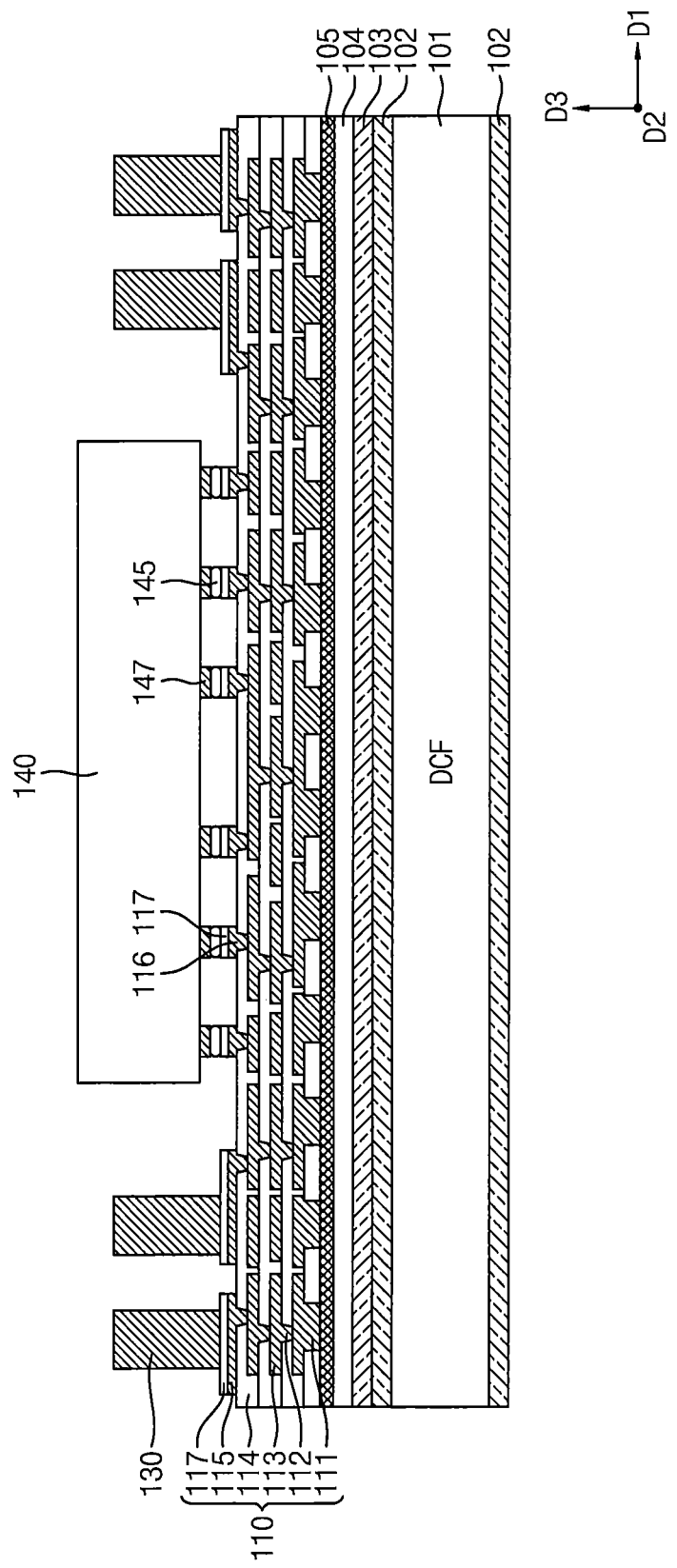

Referring to FIG. 9, the first semiconductor chip 140 may be disposed on the first redistribution layer 110. The first semiconductor chip 140 may be disposed in the second region which is a central portion of the upper surface of the first insulating layer 114. The first semiconductor chip 140 may be horizontally spaced apart from the lower posts 130. The level of an upper surface of the first semiconductor chip 140 may be higher than the level of the upper surface of the lower posts 130. The first semiconductor chip 140 may include a memory chip, a logic chip, or a combination thereof.

The first semiconductor chip 140 may be connected to the first redistribution layer 110 via chip connection terminals 145. The first semiconductor chip 140 may be electrically connected to the first redistribution connection terminals 116, the first redistribution patterns 113, and the first vias 112 via the chip connecting terminals 145. For example, the chip connection terminals 145 may be solder balls. The chip connection terminal 145 may be connected to a chip pad 147 of the first semiconductor chip 140, and may be directly connected to the first barrier layer 117 of the first redistribution layer 110. When the first semiconductor chip 140 is disposed on the first redistribution layer 110 via chip connection terminals 145, a bonding process may be performed. The bonding process may be a reflow process or a thermal compression process, without being limited thereto. The chip connection terminal 145 and the first barrier layer 117 may be bonded to each other through the bonding process.

Figure 10:
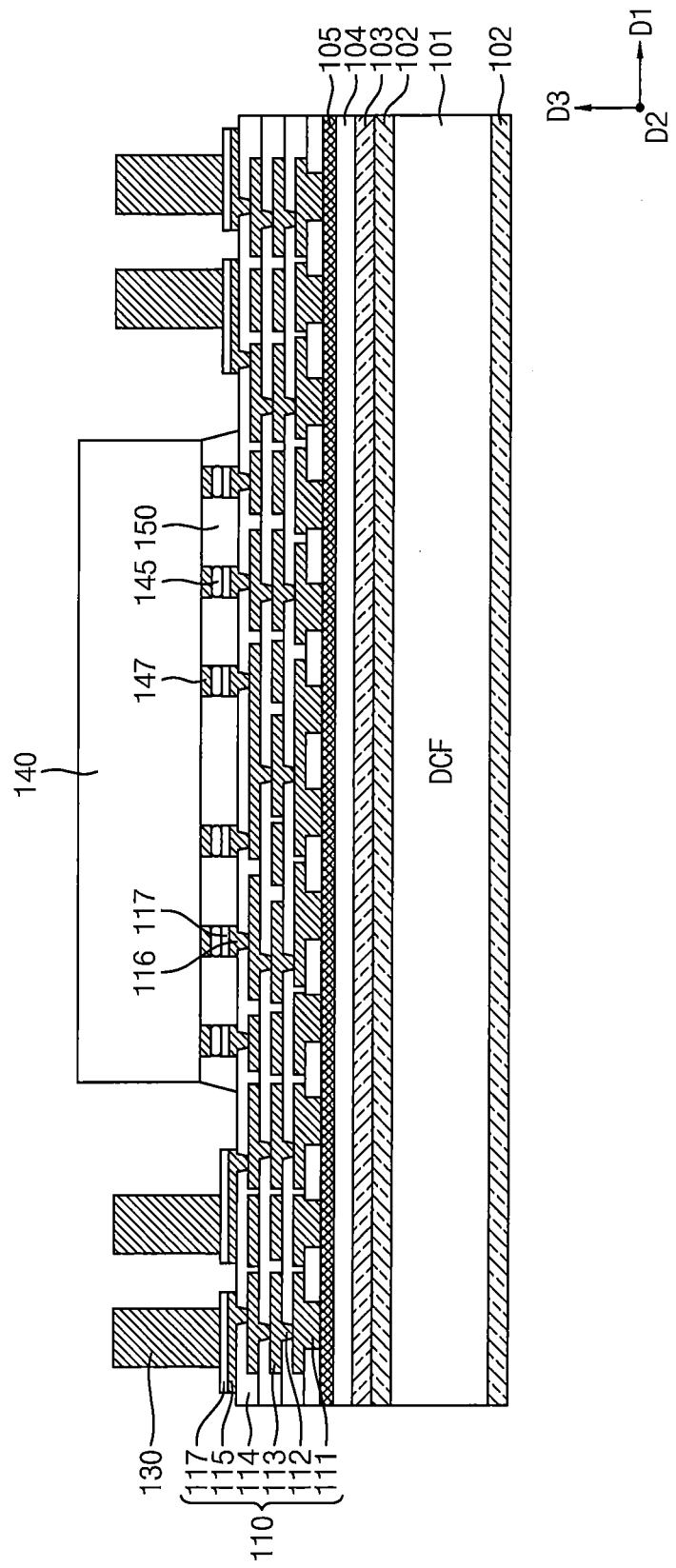

Referring to FIG. 10, an underfill layer 150 may be formed between the first semiconductor chip 140 and the first redistribution layer 110. The underfill layer 150 may surround the chip connection terminals 145 between the first semiconductor chip 140 and the first redistribution layer 110. The underfill layer 150 may cover a bottom surface of the first semiconductor chip 140, and may cover a portion of the upper surface of the first insulating layer 114. For example, the underfill layer 150 may be formed of an epoxy resin through a capillary underfill method. In some embodiments, the underfill layer 150 may be a non-conductive film (NCF).

Figure 11:
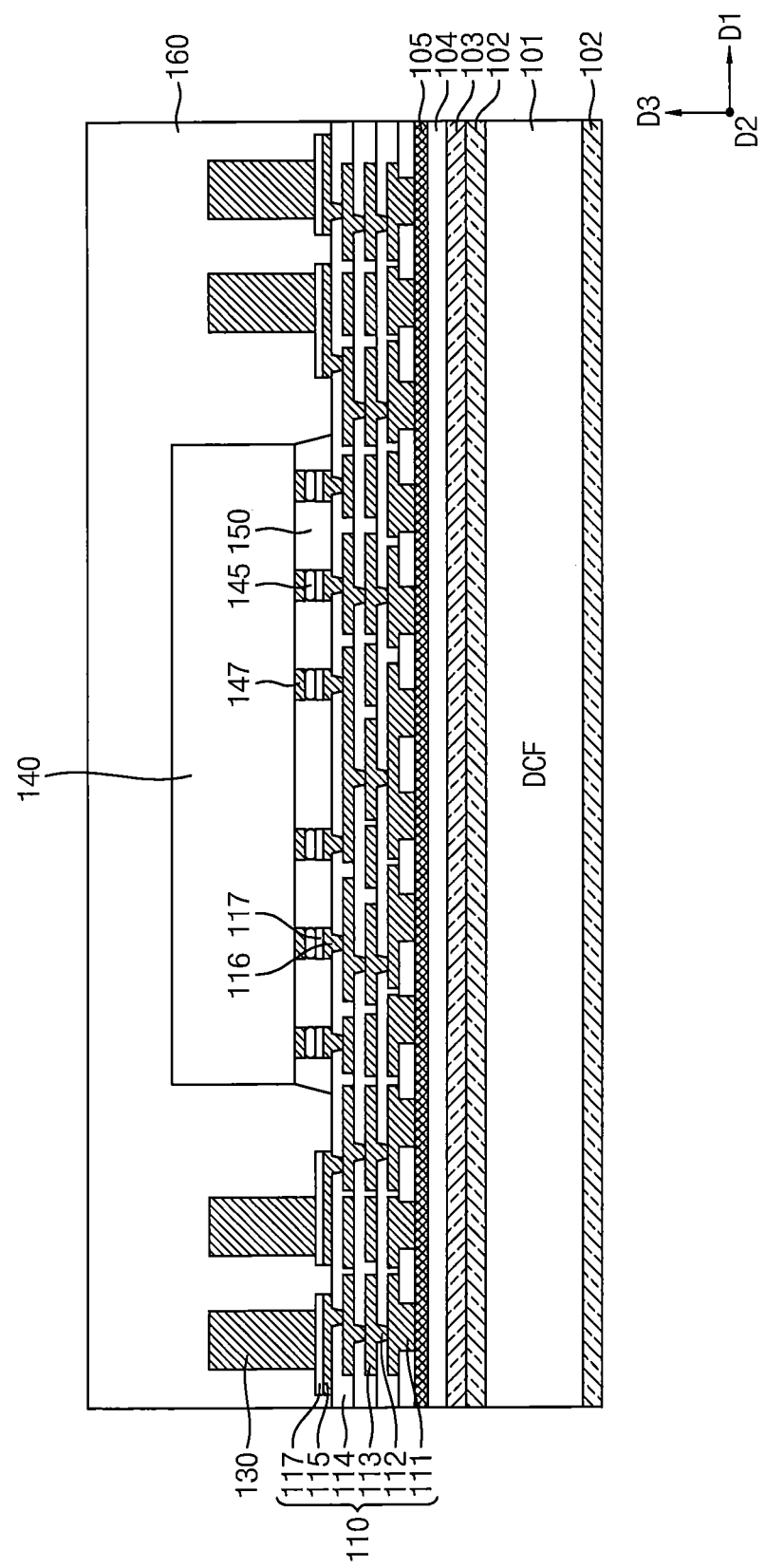

Referring to FIG. 11, a first mold layer 160 may be formed on the first redistribution layer 110. The first mold layer 160 may cover a portion of the upper surface of the first insulating layer 114, the side surface of the first redistribution outer terminals 115, a part of the first barrier layers 117, the side surface and the upper surface of the lower posts 130, a side surface of the underfill layer 150, and a side surface and the upper surface of the first semiconductor chip 140. The level of an upper surface of the first mold layer 160 may be higher than the level of the upper surface of the lower post 130 and the level of the upper surface of the first semiconductor chip 140. For example, the first mold layer 160 may include an epoxy molding compound (EMC). Of course, the example embodiments of the disclosure are not limited to the above-described condition, and the first mold layer 160 may include other insulating materials. For example, the first molding layer 160 may be formed by placing the first redistribution layer 110 provided with the first semiconductor chip 140 and the lower post 130 in a mold, and injecting a material of the first mold layer 160 into the mold.

Figure 12:
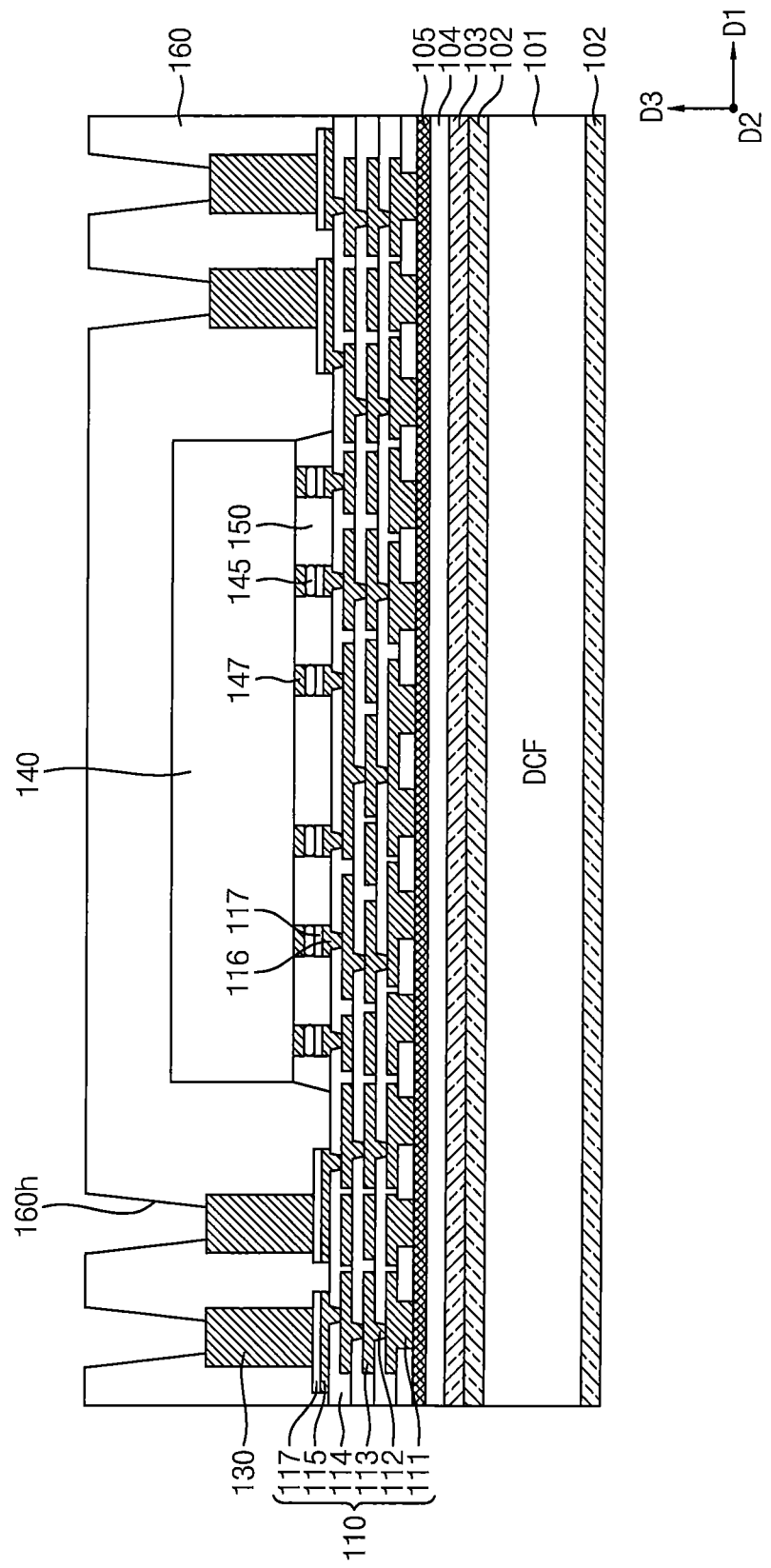

Referring to FIG. 12, the first mold layer 160 may be partially removed, thereby forming via holes 160h. The via hole 160h may have a tapered shape. The via holes 160h may have a width gradually decreasing as the via holes 160h extend from the upper surface of the first mold layer 160 toward the first redistribution layer 110. The via hole 160h may be formed using a laser drill. For example, the laser drill may be a $CO_2$ laser drill, without being limited thereto. The via holes 160h may be formed to correspond to the lower posts 130, respectively. That is, one via hole 160h may correspond to one lower post 130. Each of the via holes 160h may partially expose the upper surface of a corresponding one of the lower posts 130. A lower end of the via hole 160h may have a smaller width than the upper surface of the lower post 130.

In an embodiment, the exposed upper surface of the lower post 130 may be partially damaged in a procedure of forming the via hole 160h through a laser drilling process. In this case, a damaged portion of the lower post 130 may be removed through a wet process (for example, an etching process or a cleaning process). In this case, a recess may be formed at an upper portion of the lower post 130.

Figure 13:
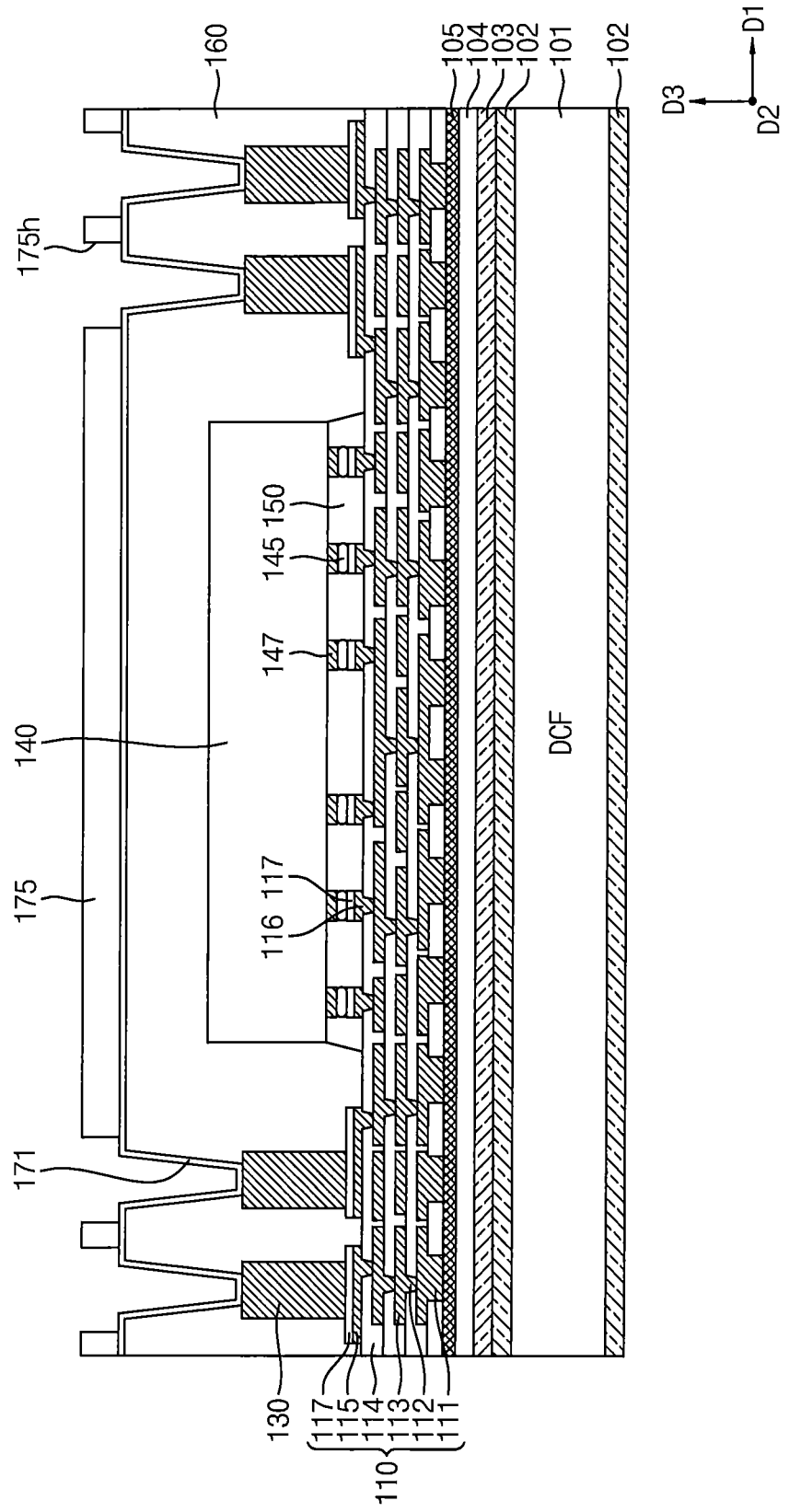

Referring to FIG. 13, a seed layer 171 may be formed on the first mold layer 160. The seed layer 171 may be chemical copper formed through electroless plating. The seed layer 171 may cover the upper surface of the first mold layer 160 and a side surface of the via hole 160h. The seed layer 171 may cover a bottom surface of the via hole 160h, that is, the upper surface of the lower post 130 exposed by the via hole 160h. The seed layer 171 may be formed in the via hole 160h such that the seed layer 171 does not completely fill the via hole 160h.

A second dry film resist (DFR) layer 175 may be formed on the seed layer 171. The second DFR layer 175 may be formed to take the form of a film laminated on the seed layer 171. Openings 175h may be formed at the second DFR layer 175 through exposure and development processes. The openings 175h may be disposed in the first region which is the edge region of the upper surface of the first insulating layer 114. The opening 175h may be formed to vertically overlap or align with the via hole 160h. The openings 175h may correspond to the via holes 160h, respectively. That is, one opening 175h may correspond to one via hole 160h. The opening 175h may communicate with the via hole 160h. A portion of the seed layer 171 may be exposed through the opening 175h.

Figure 14:
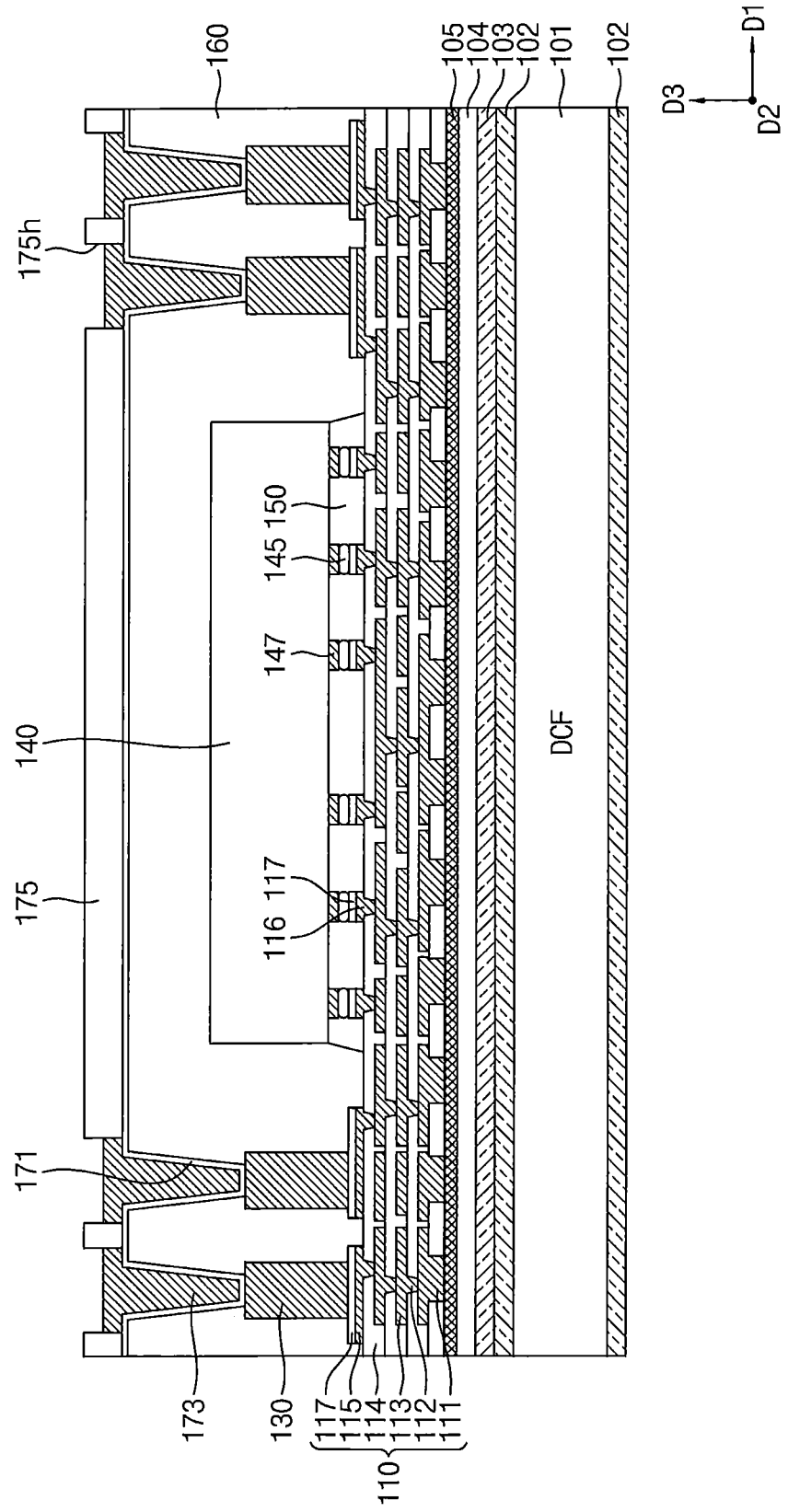

Referring to FIG. 14, conductive structures 173 may be formed in the via holes 160h. One conductive structure 173 may be formed in one via hole 160h. The conductive structure 173 may be formed on the seed layer 171 in the via hole 160h. The conductive structure 173 may completely fill the via hole 160h. The conductive structure 173 may fill at least a portion of the opening 175h of the second DFR layer 175.

Figure 15:
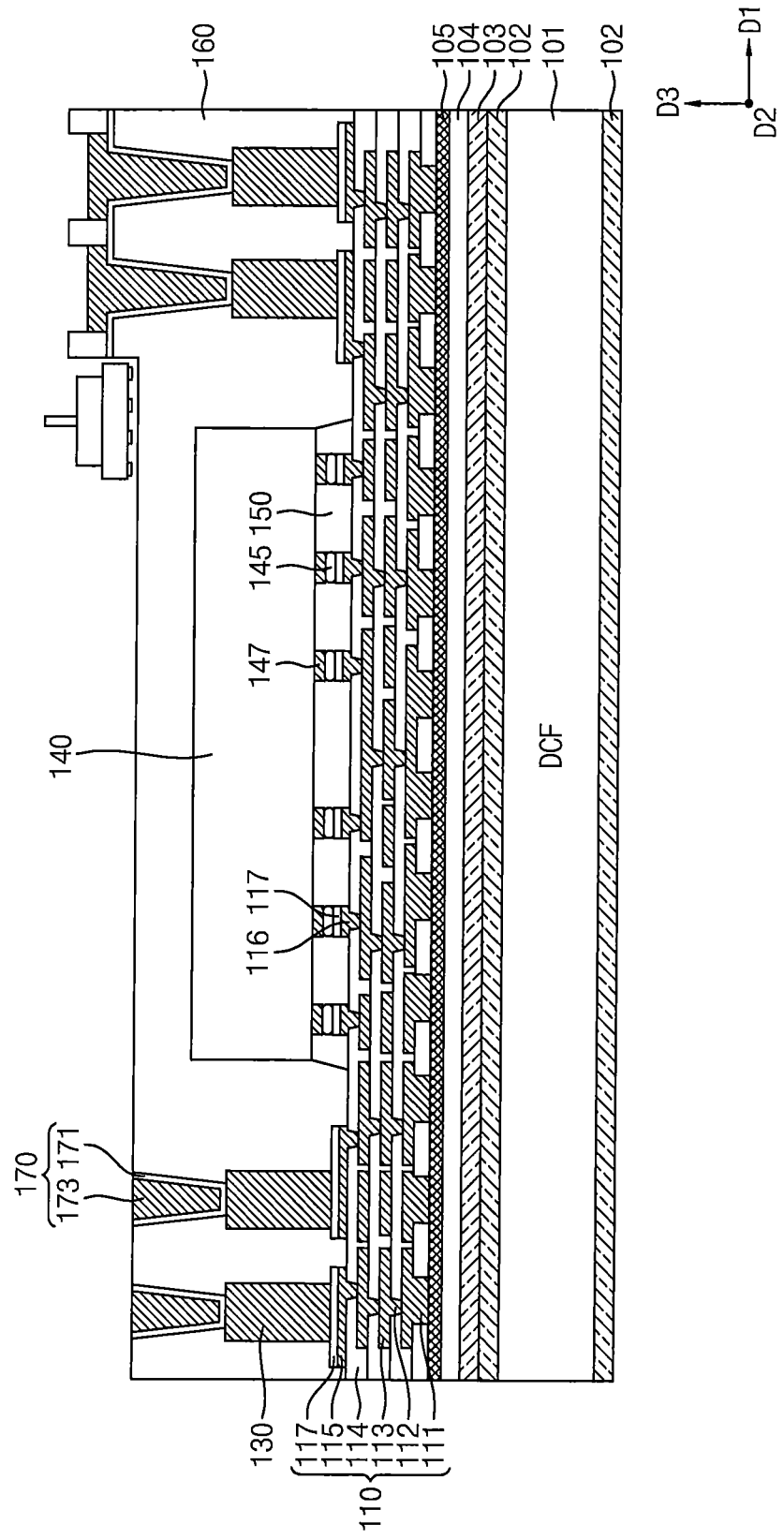

Referring to FIG. 15, the second DFR layer 175 may be removed, and a portion of the first mold layer 160, a portion of the seed layer 171 and portions of the conductive structures 173 may also be removed. For example, the second DFR layer 175, the portion of the first mold layer 160, the portion of the seed layer 171 and the portions of the conductive structures 173 may be removed through execution of a grinding process. As the portion of the first mold layer 160 and the portions of the conductive structures 173 are removed, the height of the first mold layer 160 and the height of the conductive structures 173 may be lowered. As the portion of the seed layer 171 and the portions of the conductive structures 173 are removed, upper posts 170 may be formed. The upper posts 170 may be electrically insulated and physically separated from one another. An upper surface of the upper post 170 and an upper surface of the first mold layer 160 may be coplanar. The upper surface of the upper post 170 and the upper surface of the first mold layer 160 may have a higher level than the upper surface of the first semiconductor chip 140 with reference to a bottom surface of the first insulating layer 114.

Figure 16:
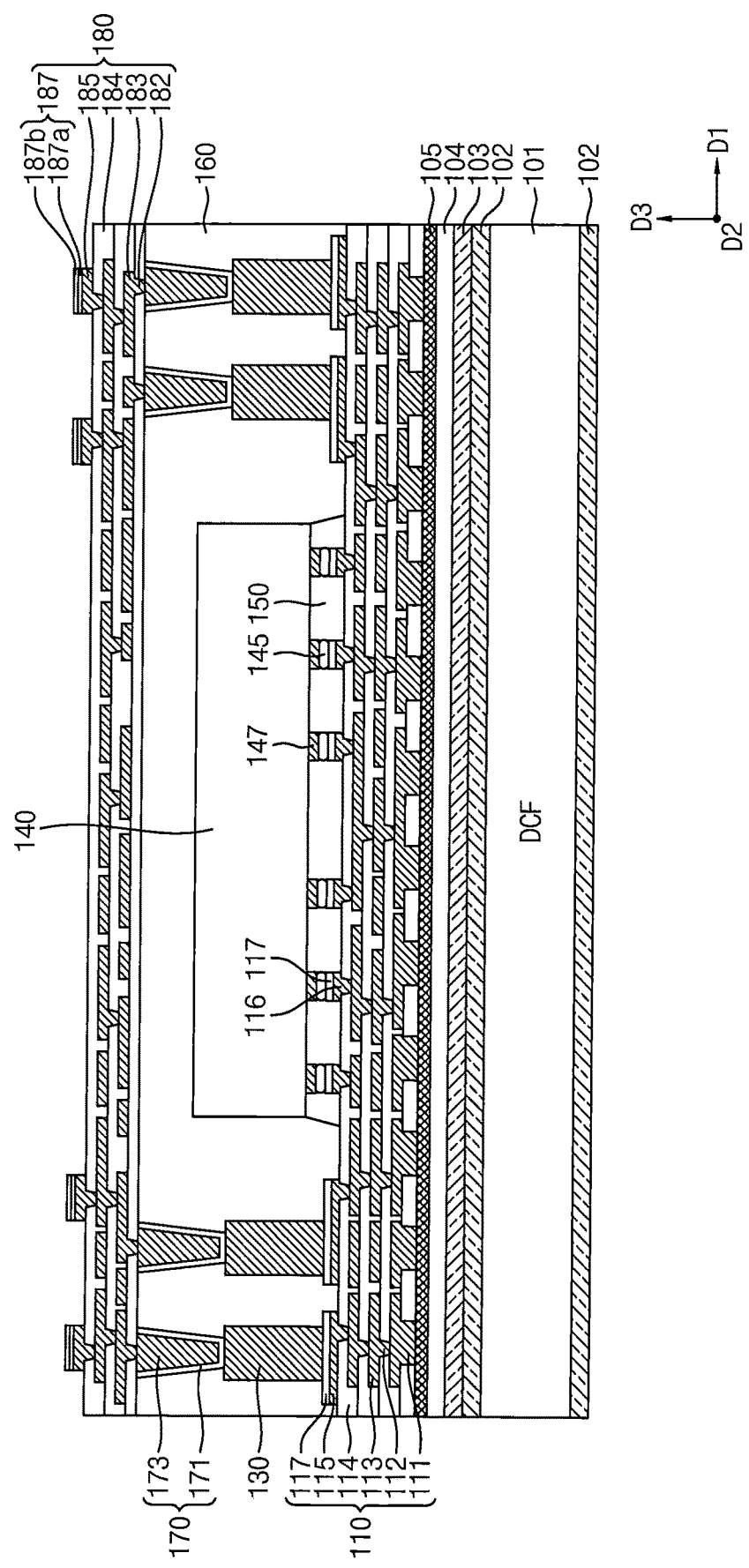

Referring to FIG. 16, a second redistribution layer 180 may be formed on the upper post 170 and the first mold layer 160. The second redistribution layer 180 may be formed using a method identical or similar to that of the first redistribution layer 110. The second redistribution layer 180 may include second vias 182, second redistribution patterns 183, second insulating layers 184, second redistribution outer terminals 185, and second barrier layers 187.

Figure 17:
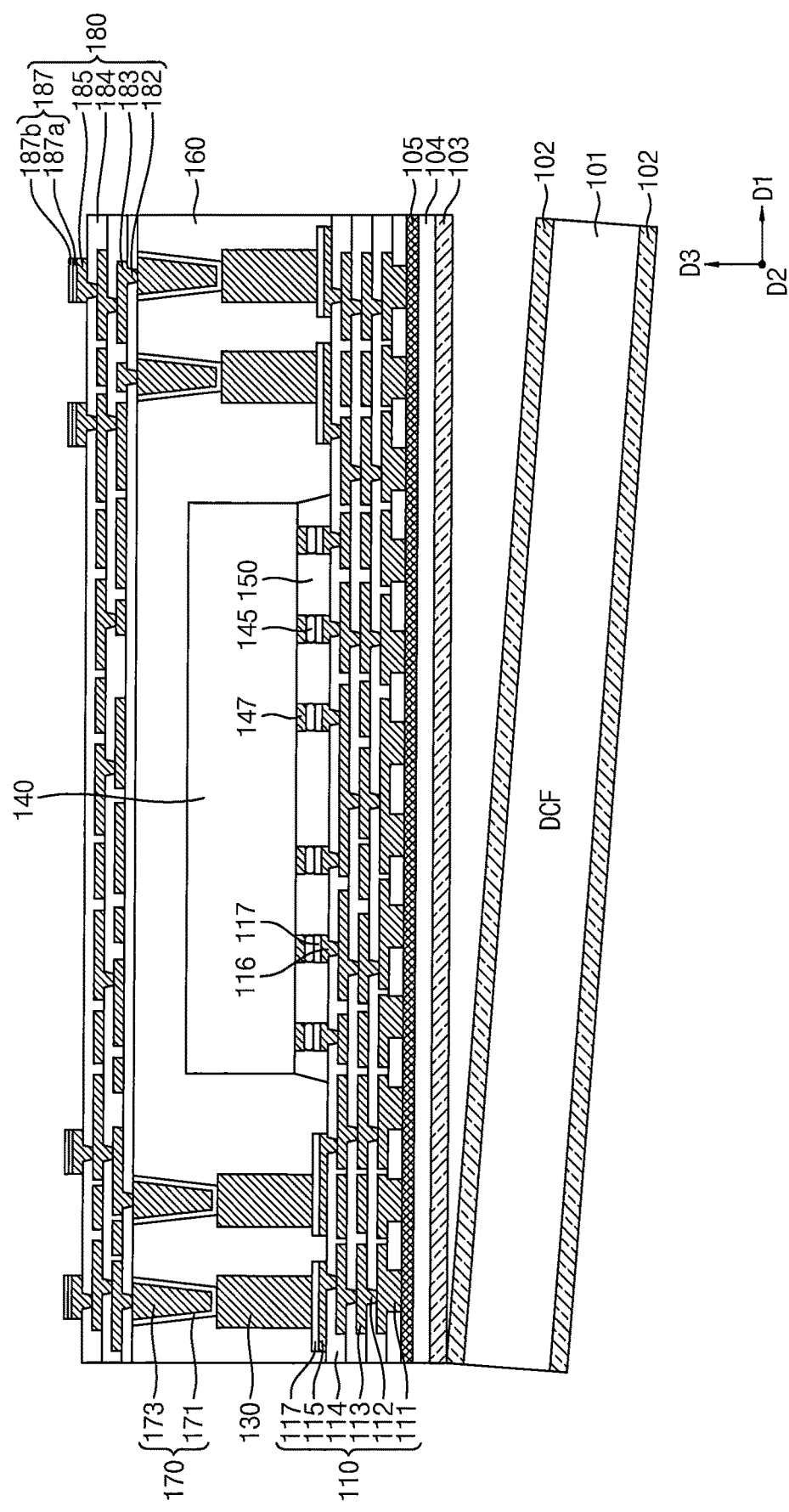

Referring to FIG. 17, the carrier film 101 and 102 may be removed from the release layer 103. The carrier film 101 and 102 and the release layer 103 may be separated from each other through predetermined external force. As the carrier film 101 and 102 is removed, a bottom surface of the release layer 103 may be exposed.

Figure 18:
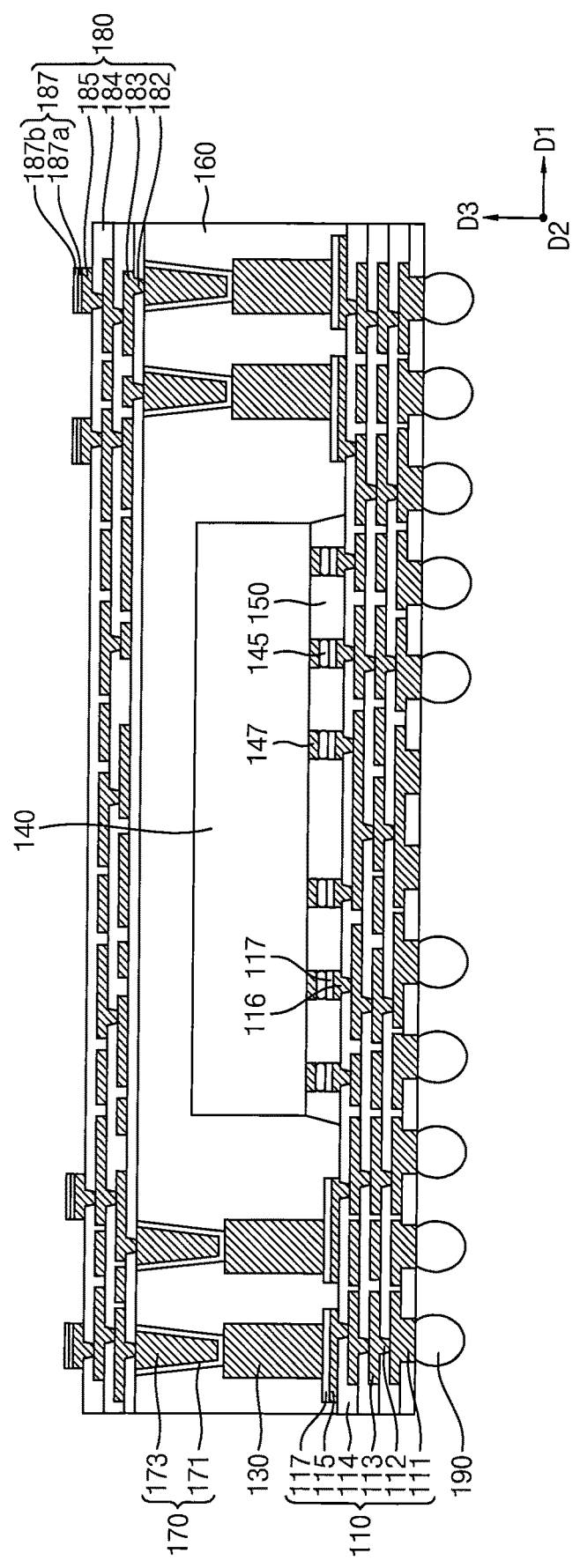

Referring to FIG. 18, the release layer 103, the insulating layer 104, and the seed layer 105 may be sequentially removed. Each of the release layer 103 and the seed layer 105 may be removed through an etching process. The insulating layer 104 may be removed through a plasma process. As the release layer 103, the insulating layer 104, and the seed layer 105 are removed, a bottom surface of the first redistribution layer 110 may be exposed. A bottom surface of the lowermost first insulating layer 114 and a bottom surface of the first under bump pattern 111 may be exposed at the bottom surface of the first redistribution layer 110. An outer connection terminal 190 may be connected to the first under bump pattern 111. As a result, a first semiconductor package 100 (cf. FIG. 1) may be formed. Thereafter, a second semiconductor package 200 may be disposed on the second redistribution layer 180, as shown in FIG. 1. In an embodiment, the second semiconductor package 200 may be disposed before formation of the outer connection terminal 190.

In accordance with the example embodiments of the disclosure, a semiconductor package having enhanced reliability while securing a desired post height by forming a lower post, forming a mold layer, and laser-machining the mold layer, thereby forming an upper post. In accordance with security of a desired post height, the semiconductor package may have an increased thickness and, as such, heat dissipation characteristics of the semiconductor package may also be enhanced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
   a first redistribution layer comprising a first via, a first redistribution pattern, and a first insulating layer;
   a first semiconductor chip connected to the first redistribution layer via a chip connection terminal;
   a lower post directly connected to the first redistribution layer;
   an upper post connected to an upper surface of the lower post;
   a first mold layer at least partially covering the first redistribution layer, the first semiconductor chip, the lower post, and the upper post; and
   a second redistribution layer on the upper post and the first mold layer,
   wherein the upper post has a width that gradually increases as the upper post extends from the lower post toward the second redistribution layer, and
   wherein an upper surface of the upper post is coplanar with an upper surface of the first mold layer.

2. The semiconductor package according to claim 1, wherein the upper post comprises:
   a conductive structure; and
   a seed layer covering a bottom surface and a side surface of the conductive structure.

3. The semiconductor package according to claim 1, wherein a bottom surface of the upper post has a smaller width than the lower post.

4. The semiconductor package according to claim 1, wherein the first mold layer contacts a portion of the upper surface of the lower post.

5. The semiconductor package according to claim 1, wherein a side surface of the upper post is inclined with respect to the upper surface of the lower post.

6. The semiconductor package according to claim 5, wherein the side surface of the upper post and the upper surface of the lower post define an angle of about 75 to 80°.

7. The semiconductor package according to claim 1, wherein:
   the first redistribution layer comprises:
      a first redistribution outer terminal on the first insulating layer; and
      a first barrier layer on the first redistribution outer terminal; and
   the lower post is on the first barrier layer.

8. The semiconductor package according to claim 7, wherein:
   the second redistribution layer comprises a second via, a second redistribution pattern, and a second insulating layer; and
   the second via interconnects the upper post and the second redistribution pattern.

9. The semiconductor package according to claim 1, wherein a height of the lower post and a height of the upper post are substantially equal.

10. The semiconductor package according to claim 1, wherein a vertical level of the upper surface of the lower post is lower than a vertical level of an upper surface of the first semiconductor chip.

11. The semiconductor package according to claim 1, wherein the lower post comprises a recess.

12. The semiconductor package according to claim 11, wherein:
   the upper post completely covers the recess; and
   a vertical level of a lowermost end of the upper post is lower than a vertical level of the upper surface of the lower post.

13. The semiconductor package according to claim 1, further comprising:
   a second semiconductor package on the second redistribution layer, the second semiconductor package comprising a package substrate and a second semiconductor chip on the package substrate.

14. A semiconductor package comprising:
   a first redistribution layer comprising a first via, a first redistribution pattern, and a first insulating layer;
   a first semiconductor chip connected to the first redistribution layer;
   a lower post directly connected to the first redistribution layer;
   an upper post connected to the lower post;

a first mold layer at least partially covering the first redistribution layer, the first semiconductor chip, the lower post, and the upper post; and a second redistribution layer on the upper post and the first mold layer, wherein the upper post has a width that gradually increases as the upper post extends from the lower post toward the second redistribution layer, wherein an upper surface of the upper post is coplanar with an upper surface of the first mold layer, and wherein the first mold layer covers a portion of an upper surface of the lower post.

15. The semiconductor package according to claim 14, wherein a vertical level of the upper surface of the lower post is lower than a vertical level of an upper surface of the first semiconductor chip.

16. The semiconductor package according to claim 14, further comprising:

a chip connection terminal interconnecting the first semiconductor chip and the first redistribution layer; and an underfill layer between the first semiconductor chip and the first redistribution layer and surrounding the chip connection terminal.

17. The semiconductor package according to claim 14, wherein the upper post comprises:

a conductive structure; and a seed layer surrounding a bottom surface and a side surface of the conductive structure.

18. The semiconductor package according to claim 17, wherein an upper surface of the conductive structure is coplanar with an upper end of the seed layer.

19. The semiconductor package according to claim 14, wherein the upper post is directly connected to the second redistribution layer.

20. A semiconductor package comprising:

a first semiconductor package; and a second semiconductor package on the first semiconductor package, wherein the first semiconductor package comprises:

a first redistribution layer comprising a first via, a first redistribution pattern, and a first insulating layer;

a first semiconductor chip connected to the first redistribution layer via a chip connection terminal;

an underfill layer between the first semiconductor chip and the first redistribution layer and surrounding the chip connection terminal;

a lower post directly connected to the first redistribution layer;

an upper post connected to an upper surface of the lower post;

a first mold layer at least partially covering the first redistribution layer, the first semiconductor chip, the underfill layer, the lower post, and the upper post; and a second redistribution layer on the upper post and the first mold layer, wherein the upper post has a width that gradually increases as the upper post extends from the lower post toward the second redistribution layer, wherein an upper surface of the upper post is coplanar with an upper surface of the first mold layer, and wherein the first mold layer covers a portion of the upper surface of the lower post.

* * * * *